United States Patent
Wu

(10) Patent No.: US 9,581,648 B2
(45) Date of Patent: Feb. 28, 2017

(54) RELAY WELDING DETECTOR, RELAY EQUIPMENT INCORPORATING THE SAME, AND RELAY WELDING DETECTING METHOD

(71) Applicant: LITE-ON CLEAN ENERGY TECHNOLOGY CORP., Taipei (TW)

(72) Inventor: Zhi-Feng Wu, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 545 days.

(21) Appl. No.: 14/141,656

(22) Filed: Dec. 27, 2013

(65) Prior Publication Data

US 2015/0146333 A1  May 28, 2015

(30) Foreign Application Priority Data

Nov. 28, 2013  (TW) .............................. 102143462 A
Nov. 28, 2013  (TW) .............................. 102222321 U

(51) Int. Cl.
*G01R 31/327*  (2006.01)
*H01H 47/00*  (2006.01)

(52) U.S. Cl.
CPC ....... *G01R 31/3278* (2013.01); *H01H 47/002* (2013.01); *H01H 2047/003* (2013.01); *H01H 2300/052* (2013.01)

(58) Field of Classification Search
CPC ............. G01R 31/3278; H01H 47/002; H01H 2300/052; H01H 2047/003
See application file for complete search history.

(56) References Cited

U.S. PATENT DOCUMENTS 3,668,469 A * 6/1972 Lee ...................... H02H 11/001
361/46
3,786,356 A * 1/1974 MacPhee ............... H02H 3/335
361/45

(Continued)

FOREIGN PATENT DOCUMENTS

CN       102074979 B    10/2013
EP         0772216 A1     5/1997

(Continued)

OTHER PUBLICATIONS

Communication From the European Patent Office Regarding a Counterpart Foreign Application Dated Jul. 8, 2014.

(Continued)

*Primary Examiner* — Zeev V Kitov
(74) *Attorney, Agent, or Firm* — Rosenberg, Klein & Lee

(57) ABSTRACT

A relay welding detector is adapted for detecting welding fault of a relay. The relay has a first electrical contact coupled to a neutral terminal of an alternating current (AC) power source through a first power line, and a second electrical contact coupled to a load through a second power line. The relay welding detector includes a signal generator generating a test signal, a current transformer wound with a portion of one of the power lines and generating an induced signal based on the test signal, and a determining unit determining, based on the induced signal, whether the electrical contacts of the relay are welded to each other.

7 Claims, 4 Drawing Sheets

(56) References Cited

U.S. PATENT DOCUMENTS

| | | | | |
|---|---|---|---|---|
| 5,761,018 A | * | 6/1998 | Blakely | H02H 6/005 |
| | | | | 318/430 |
| 8,558,504 B2 | * | 10/2013 | Brown | B60L 3/0069 |
| | | | | 320/109 |
| 2002/0060894 A1 | * | 5/2002 | Horibata | H03K 17/0824 |
| | | | | 361/100 |
| 2003/0030440 A1 | | 2/2003 | Yugou | |
| 2007/0035903 A1 | * | 2/2007 | Sullivan | B60P 1/4478 |
| | | | | 361/78 |
| 2010/0033140 A1 | | 2/2010 | Otake | |
| 2011/0121780 A1 | | 5/2011 | Fukuo et al. | |
| 2011/0122536 A1 | * | 5/2011 | Watanabe | B60L 3/0069 |
| | | | | 361/46 |
| 2011/0299212 A1 | | 12/2011 | Kuo | |
| 2012/0105065 A1 | * | 5/2012 | Namou | G01R 31/3275 |
| | | | | 324/415 |

FOREIGN PATENT DOCUMENTS

| | | |
|---|---|---|
| JP | H10-125459 A | 5/1998 |
| JP | H11-144591 A | 5/1999 |
| JP | 2008-312380 A | 12/2008 |
| JP | 2009-32413 A | 2/2009 |
| TW | 201145338 A1 | 12/2011 |

OTHER PUBLICATIONS

Search Report Communication From the Taiwan Patent Office With Translation.

* cited by examiner

RELAY WELDING DETECTOR, RELAY EQUIPMENT INCORPORATING THE SAME, AND RELAY WELDING DETECTING METHOD

CROSS-REFERENCE TO RELATED APPLICATION

This application claims priority of Taiwanese Applications Nos. 102143462 and 102222321, both filed on Nov. 23, 2013, the contents of which are hereby incorporated by reference.

BACKGROUND OF THE INVENTION

1. Field of the Invention

This invention relates to relay welding detection, and more particularly to a relay welding detector, a relay equipment incorporating the same, and a relay welding detecting method.

2. Description of the Related Art

In Europe, China and Taiwan, an alternating current (AC) power source has a live terminal, a grounded earth terminal and a neutral terminal coupled to the earth terminal. A relay may be coupled between the AC power source and a load so as to enable or disable power transfer from the AC power source to the load.

However, when the relay encounters welding fault, the relay may not be able to disable the power transfer from the AC power source to the load. Therefore, in order to meet safety requirements set up for various regional markets, such as U.S. and Europe, there is a need to detect whether the relay has welding fault. For instance, GE Corporation uses mechanical linkages to detect welding fault of the relay, which results in relatively high costs, hence, it is not competitive enough in the markets.

SUMMARY OF THE INVENTION

Therefore, an object of the present invention is to provide a relay welding detector, a relay equipment incorporating the same, and a relay welding detecting method, that can overcome the aforesaid drawbacks associated with the prior art.

According to one aspect of this invention, a relay welding detector is adapted for detecting welding fault of a relay that is coupled between an alternating current (AC) power source and a load. The AC power source has a grounded earth terminal and a neutral terminal coupled to the earth terminal. The relay has a first electrical contact coupled to the neutral terminal of the AC power source through a first power line, and a second electrical contact coupled to the load through a second power line. The relay welding detector comprises a signal generator, a current transformer and a determining unit. The signal generator generates a test signal. The current transformer is coupled to the signal generator for receiving the test signal therefrom, is configured to generate an induced signal based on the test signal, and is adapted to be wound with a portion of one of the first and second power lines. The determining unit is coupled to the current transformer for determining, based on the induced signal from the current transformer, whether the first and second electrical contacts of the relay are welded to each other.

According to another aspect of this invention, a relay equipment is adapted to be coupled between an alternating current (AC) power source and a load. The AC power source has a grounded earth terminal and a neutral terminal coupled to the earth terminal. The relay equipment comprises a relay and a relay welding detector. The relay has a first electrical contact adapted to be coupled to the neutral terminal of the AC power source through a first power line, and a second electrical contact adapted to be coupled to the load through a second power line. The relay welding detector includes a signal generator, a current transformer and a determining unit. The signal generator generates a test signal. The current transformer is coupled to the signal generator for receiving the test signal therefrom, is configured to generate an induced signal based on the test signal, and is adapted to be wound with a portion of one of the first and second power lines. The determining unit is coupled to the current transformer for determining, based on the induced signal from the current transformer, whether the first and second electrical contacts of the relay are welded to each other.

According to yet another aspect of this invention, there is provided a relay welding detecting method for detecting, using a relay welding detector, welding fault of a relay that is coupled between an alternating current (AC) power source and a load. The AC power source has a grounded earth terminal and a neutral terminal coupled to the earth terminal. The relay has a first electrical contact coupled to the neutral terminal of the AC power source through a first power line, and a second electrical contact coupled to the load through a second power line. The relay welding detector includes a signal generator, a current transformer coupled to the signal generator and wound with a portion of one of the first and second power lines, and a determining unit coupled to the current transformer. The relay welding detecting method comprises the steps of:

(A) generating, by the signal generator of the relay welding detector, a test signal;

(B) generating, by the current transformer of the relay welding detector, an induced signal based on the test signal; and (C) determining, by the determining unit of the relay welding detector, based on the induced signal, whether the first and second electrical contacts of the relay are welded to each other.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION OF THE PREFERRED EMBODIMENT

Figure 1:
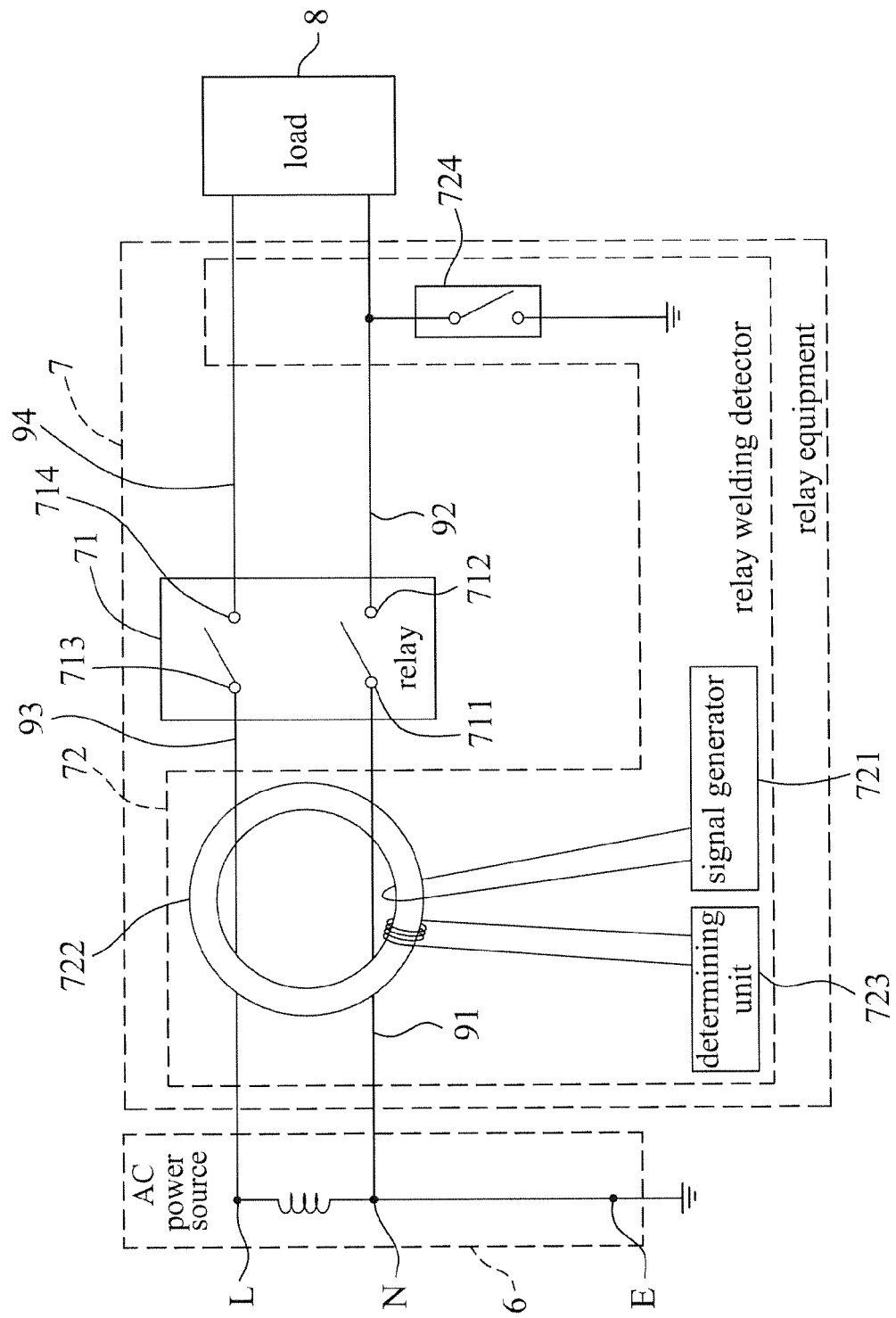
FIG. 1 is a schematic circuit block diagram illustrating the preferred embodiment of a relay equipment according to this invention.

Referring to FIG. 1, the preferred embodiment of a relay equipment 7 according to this invention is adapted to be coupled between an alternating current (AC) power source 6 and a load 8. The AC power source 6 has a live terminal (L), a grounded earth terminal (E), and a neutral terminal (N)

coupled to the earth terminal (E). The relay equipment 7 includes a relay 71 and a relay welding detector 72.

The relay 71 has a first electrical contact 711 coupled to the neutral terminal (N) of the AC power source 6 through a first power line 91, a second electrical contact 712 coupled to the load 8 through a second power line 92, a third electrical contact 713 coupled to the live terminal (L) of the AC power source 6 through a third power line 93, and a fourth electrical contact 714 coupled to the load 8 through a fourth power line 94. The relay 71 is operable between an ON state and an OFF state. When the relay 71 operates in the ON state, electrical connection between the first and second electrical contacts 711, 712 and electrical connection between the third and fourth electrical contacts 713, 714 are established. Moreover, when the first and second electrical contacts 711, 712 are welded to each other, the electrical connection between the first and second electrical contacts 711, 712 is established, and when the third and fourth electrical contacts 713, 714 are welded to each other, the electrical connection between the third and fourth electrical contacts 713, 714 is established.

Figure 2:
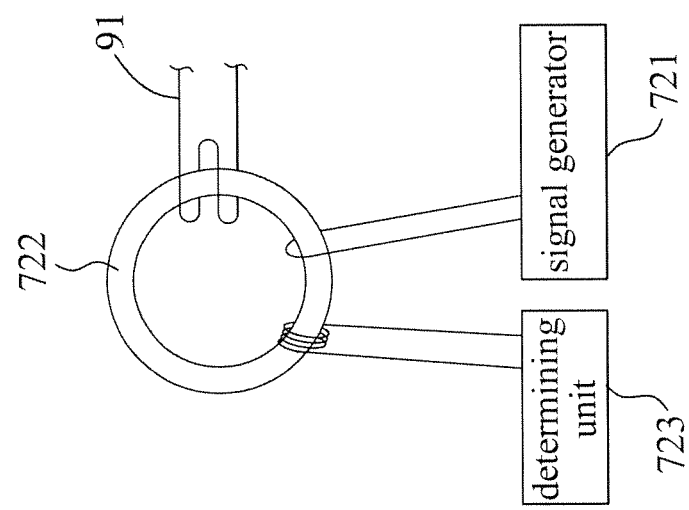
FIG. 2 is a schematic circuit block diagram illustrating a current transformer of the relay equipment wound with multiple turns of a power line.

The relay welding detector 72 includes a signal generator 721, a current transformer 722, a determining unit 723 and a switch 724. The current transformer 722 is coupled to the signal generator 721, and is adapted to be wound with a portion of the first power line 91 by one turn or by multiple turns (see FIG. 2). The determining unit 723 is coupled to the current transformer 722. The switch 724 is operable between an ON state and an OFF state, and is adapted to be coupled between ground and the second power line 92. The switch 724 is coupled to one end of the second power line 92 near the relay 71, such that the AC power source 6, the first power line 91, the relay 71 and the switch 724 form a closed electrical loop when the electrical connection between the first and second electrical contacts 711, 712 of the relay 71 is established and the switch 724 operates in the ON state. In other embodiments, the switch 724 may be coupled to the other end of the second power line 92 near the load 8 or to a node between the ends of the second power line 92, such that the AC power source 6, the first power line 91, the relay 71, at least a portion of the second power line 92 and the switch 724 form a closed electrical loop when the electrical connection between the first and second electrical contacts 711, 712 of the relay 71 is established and the switch 724 operates in the ON state.

Figure 3:
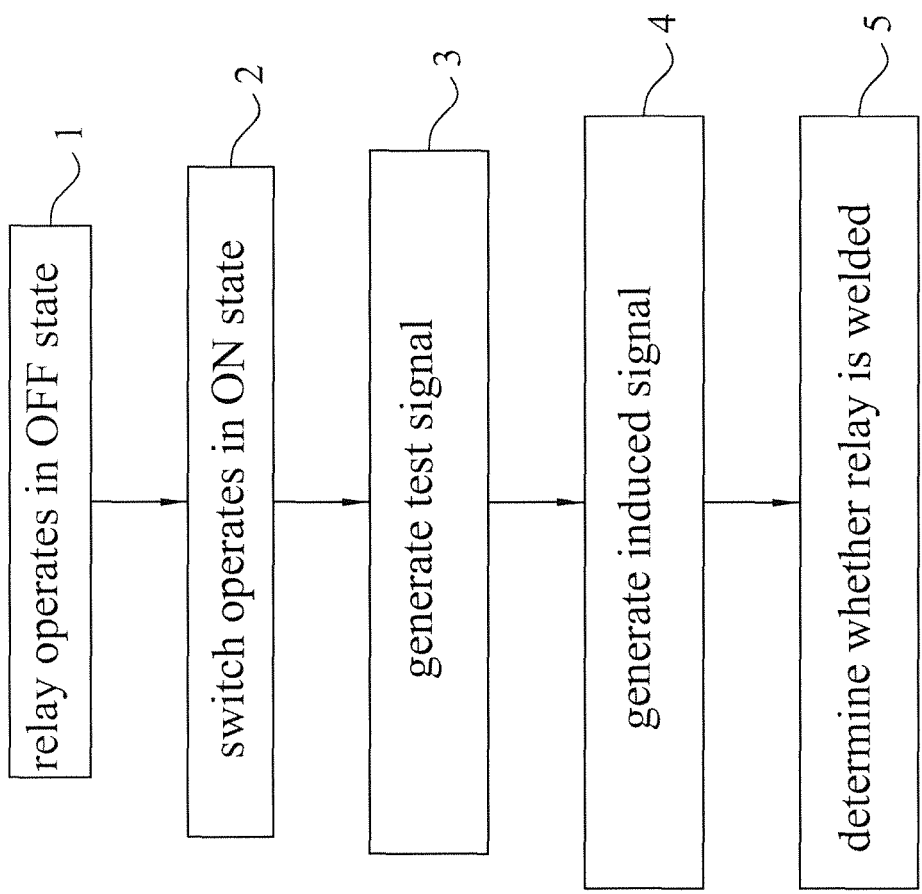
FIG. 3 is a flow chart illustrating the preferred embodiment of a relay welding detecting method according to this invention.

Referring to FIGS. 1 and 3, the preferred embodiment of a relay welding detecting method according to this invention detects, using the relay welding detector 72, welding fault of the relay 71. The relay welding detecting method includes the following steps 1-5.

In step 1, the relay 71 is configured to operate in the OFF state.

In step 2, the switch 724 of the relay welding detector 72 is configured to operate in the ON state.

In step 3, the signal generator 721 of the relay welding detector 72 generates a test signal. For example, the test signal is, but not limited to, a current signal that has an amplitude with a root mean square of 30 mA and that has a frequency of 100 Hz or 1 KHz.

In step 4, the current transformer 722 of the relay welding detector 72 generates an induced signal based on the test signal received from the signal generator 721 of the relay welding detector 72. The induced signal is generated regardless of whether or not the closed electrical loop is formed. In this embodiment, the induced signal is a current signal having an amplitude that is equal to a first value when the closed electrical loop is not formed and that is equal to a second value smaller than the first value when the closed electrical loop is formed. Both the first and second values vary with the frequency of the test signal and a turn number of the first power line 91.

In step 5, the determining unit 723 of the relay welding detector 72 determines, based on the induced signal received from the current transformer 722 of the relay welding detector 72, whether the first and second electrical contacts 711, 712 of the relay 71 are welded to each other. In this embodiment, the determining unit 723 of the relay welding detector 72 pre-stores a predetermined threshold value between the first and second values, compares the amplitude of the induced signal with the threshold value, and determines, based on the result of the comparison, whether the first and second electrical contacts 711, 712 of the relay 71 are welded to each other. The determining unit 723 of the relay welding detector 72 determines that the first and second electrical contacts 711, 712 of the relay 71 are welded to each other when the result of the comparison indicates that the amplitude of the induced signal is smaller than the threshold value.

Figure 4:
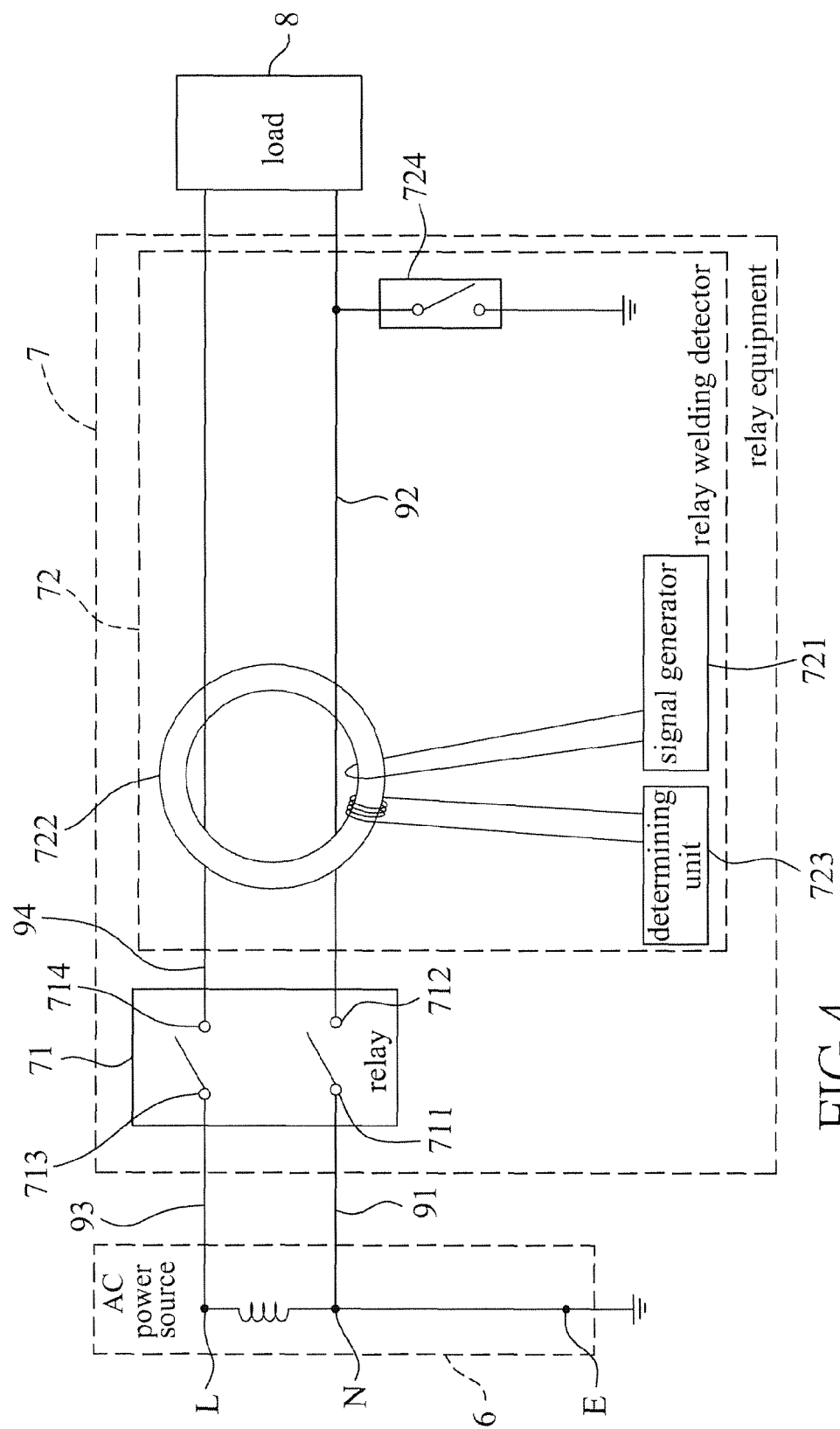
FIG. 4 is a schematic circuit block diagram illustrating a modification of the relay equipment.

Referring to FIG. 4, it is noted that the current transformer 722 of the relay welding detector 72 may be wound with a wound portion of the second power line 92, instead of the portion of the first power line 91 (see FIG. 1). In this case, the switch 724 is coupled to one end of the second power line 92 near the load 8, or is coupled to a node of the second power line 92 between the wound portion and said one end of the same. As a result, the AC power source 6, the first power line 91, the relay 71, at least a portion of the second power line 92 between the other end near the relay 71 and the node of the same (containing the wound portion of the second power line 92), and the switch 724 form a closed electrical loop.

In application, the relay equipment 7 may be installed in a device capable of generating a warning output, such as light or sound, when the determining unit 723 of the relay welding detector 72 determines that the first and second electrical contacts 711, 712 of the relay 71 are welded to each other so as to inform a user of the welding fault of the relay 71.

In view of the above, compared to the conventionally used mechanical linkages, the relay welding detector 72 of this embodiment is relatively simple, which results in relatively low costs.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A relay welding detector adapted for detecting welding fault of a relay that is coupled between an alternating current (AC) power source and a load, the AC power source having a grounded earth terminal and a neutral terminal coupled to the earth terminal, the relay having a first electrical contact coupled to the neutral terminal of the AC power source through a first power line, and a second electrical contact coupled to the load through a second power line, said relay welding detector comprising:

a signal generator for generating a test signal;

a current transformer coupled to said signal generator for receiving the test signal therefrom, configured to generate an induced signal based on the test signal, and adapted to be wound with a portion of one of the first and second power lines; and a determining unit coupled to said current transformer, wherein said determining unit is configured to pre-store a predetermined threshold value, and is further configured to compare an amplitude of the induced signal from said current transformer with the predetermined threshold value, and is further configured to determine, based on a result of the comparison, whether the first and second electrical contacts of the relay are welded to each other;

wherein said determining unit determines that said first and second electrical contacts of said relay are welded to each other when the result of the comparison indicates that the amplitude of the induced signal is smaller than the threshold value.

2. The relay welding detector of claim 1, further comprising a switch operable between an ON state and an OFF state, and adapted to be coupled between ground and the second power line, such that at least the relay, the portion of said one of the first and second power lines and said switch form a closed electrical loop when electrical connection between the first and second electrical contacts of the relay is established and said switch operates in the ON state.

3. The relay welding detector of claim 1, wherein said current transformer is adapted to be wound with the portion of the first power line.

4. The relay welding detector of claim 1, wherein said current transformer is adapted to be wound with the portion of the second power line.

5. A relay equipment system adapted to be coupled between an alternating current (AC) power source and a load, the AC power source having a grounded earth terminal and a neutral terminal coupled to the earth terminal, said relay equipment system comprising:

a relay having a first electrical contact adapted to be coupled to the neutral terminal of the AC power source through a first power line, and a second electrical contact adapted to be coupled to the load through a second power line; and a relay welding detector including
  a signal generator for generating a test signal,
  a current transformer coupled to said signal generator for receiving the test signal therefrom, configured to generate an induced signal based on the test signal, and adapted to be wound with a portion of one of the first and second power lines, and
  a determining unit coupled to said current transformer, wherein said determining unit is configured to pre-store a predetermined threshold value, and is further configured to compare an amplitude of the induced signal from said current transformer with the predetermined threshold value, and is further configured to determine, based on a result of the comparison, whether said first and second electrical contacts of said relay are welded to each other;

wherein said determining unit determines that said first and second electrical contacts of said relay are welded to each other when the result of the comparison indicates that the amplitude of the induced signal is smaller than the threshold value.

6. A relay welding detecting method for detecting, using a relay welding detector, welding fault of a relay that is coupled between an alternating current (AC) power source and a load, the AC power source having a grounded earth terminal and a neutral terminal coupled to the earth terminal, the relay having a first electrical contact coupled to the neutral terminal of the AC power source through a first power line, and a second electrical contact coupled to the load through a second power line, the relay welding detector including a signal generator, a current transformer coupled to the signal generator and wound with a portion of one of the first and second power lines, and a determining unit coupled to the current transformer, said relay welding detecting method comprising:

(A) generating, by the signal generator of the relay welding detector, a test signal;

(B) generating, by the current transformer of the relay welding detector, an induced signal based on the test signal;

(C) comparing an amplitude of the induced signal with a predetermined threshold value pre-stored in the determining unit of the relay welding detector; and (D) determining, by the determining unit of the relay welding detector, based on a result of the comparison, whether the first and second electrical contacts of the relay are welded to each other;

wherein in (D), the first and second electrical contacts of the relay are determined to be welded to each other when the result of the comparison indicates that the amplitude of the induced signal is smaller than the threshold value.

7. The relay welding detecting method of claim 6, the relay being operable between an ON state and an OFF state, the relay welding detector further including a switch operable between an ON state and an OFF state and coupled between ground and the second power line, such that at least the relay, the portion of said one of the first and second power lines and the switch form a closed electrical loop when electrical connection between the first and second electrical contacts of the relay is established and the switch operates in the ON state, said relay welding detecting method further comprising, prior to (A):

configuring the relay to operate in the OFF state; and
configuring the switch of the relay welding detector to operate in the ON state.

* * * * *